(12) United States Patent
Shieh et al.

(10) Patent No.: US 9,911,857 B2
(45) Date of Patent: Mar. 6, 2018

(54) THIN FILM TRANSISTOR WITH LOW TRAP-DENSITY MATERIAL ABUTTING A METAL OXIDE ACTIVE LAYER AND THE GATE DIELECTRIC

(75) Inventors: Chan-Long Shieh, Paradise Valley, AZ (US); Fatt Foong, Goleta, CA (US); Gang Yu, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 728 days.

(21) Appl. No.: 12/915,712

(22) Filed: Oct. 29, 2010

(65) Prior Publication Data

US 2012/0104381 A1    May 3, 2012

(51) Int. Cl.
H01L 29/786    (2006.01)

(52) U.S. Cl.
CPC .... *H01L 29/7869* (2013.01); *H01L 29/78696* (2013.01)

(58) Field of Classification Search
CPC ........... H01L 29/4908; H01L 29/66742; H01L 29/66757; H01L 29/7869; H01L 29/78696
USPC ............................... 257/40, 43, 411, E29.165
See application file for complete search history.

(56) References Cited

U.S. PATENT DOCUMENTS

| | | | |
|---|---|---|---|
| 5,340,999 A * | 8/1994 | Takeda et al. | 257/66 |
| 6,563,174 B2 * | 5/2003 | Kawasaki et al. | 257/350 |
| 8,299,470 B2 * | 10/2012 | Kang et al. | 257/72 |
| 2009/0278120 A1 * | 11/2009 | Lee et al. | 257/43 |

* cited by examiner

*Primary Examiner* — Marcos D Pizarro
(74) *Attorney, Agent, or Firm* — Parsons & Goltry; Robert Parsons; Michael W. Goltry

(57) ABSTRACT

A metal oxide semiconductor device including an active layer of metal oxide, a layer of gate dielectric, and a layer of low trap density material. The layer of low trap density material is sandwiched between the active layer of metal oxide and the layer of gate dielectric. The layer of low trap density material has a major surface parallel and in contact with a major surface of the active layer of metal oxide to form a low trap density interface with the active layer of metal oxide. A second layer of low trap density material can optionally be placed in contact with the opposed major surface of the active layer of metal oxide so that a low trap density interface is formed with both surfaces of the active layer of metal oxide.

19 Claims, 4 Drawing Sheets

THIN FILM TRANSISTOR WITH LOW TRAP-DENSITY MATERIAL ABUTTING A METAL OXIDE ACTIVE LAYER AND THE GATE DIELECTRIC

FIELD OF THE INVENTION

This invention generally relates to metal oxide thin film devices and more specifically to the stability of the metal oxide semiconductor film.

BACKGROUND OF THE INVENTION

There is a strong interest in metal oxide semiconductor because of its high carrier mobility, light transparency and low deposition temperature. The high carrier mobility expands applications to higher performance domains that require higher frequency or higher current. The light transparency eliminates the need for a light shield in display and sensor active matrices. The low deposition temperature enables application to flexible electronics on plastic passivation layers.

The unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. In order to achieve high mobility for high performance applications, the volume carrier density of the metal oxide channel should be high and thickness of the metal oxide film should be small (e.g. <100 nm and preferably <50 nm).

In thin film devices a gate dielectric is positioned over the portion of the metal oxide semiconductor layer that forms the channel for the device. The metal oxide semiconductor layer may include, for example, zinc oxide (ZnO), indium zinc oxide (InZnO), indium zinc gallium oxide (InZnGaO), etc. (see additional examples listed below). The gate dielectric is generally a material such as silicon oxide ($SiO_2$), SiN, or the like. Generally, because of the deposition temperatures, etc. the metal oxide is amorphous and, preferably remains amorphous after processing. Because of the specific materials utilized, traps or trap states are formed at the interface between the metal oxide semiconductor layer and the gate dielectric layer. If interface trap states are deep in the bandgap, the trapping and de-trapping of carriers in the interface deep traps can manifest as a stability problem, i.e. a threshold voltage shift. In this instance "stability" is defined in terms of the threshold voltage of the TFT.

It would be highly advantageous, therefore, to remedy the foregoing and other deficiencies inherent in the prior art.

Accordingly, it is an object of the present invention to provide a new and improved metal oxide semiconductor device with improved stability.

It is another object of the present invention to provide a new and improved metal oxide semiconductor device with improved stability primarily due to reduction of interface traps.

It is another object of the present invention to provide a new and improved method of fabricating a metal oxide semiconductor device with a substantial reduction of interface traps.

SUMMARY OF THE INVENTION

Briefly, to achieve the desired objects of the instant invention in accordance with a preferred embodiment thereof, provided is a metal oxide semiconductor device including an active layer of metal oxide, a layer of gate dielectric, and a layer of low trap density material. The layer of low trap density material is sandwiched between the active layer of metal oxide and the layer of gate dielectric. The layer of low trap density material has a major surface parallel and in contact with a major surface of the active layer of metal oxide to form a low trap density interface with the active layer of metal oxide. A second layer of low trap density material can optionally be placed in contact with the opposed major surface of the active layer of metal oxide so that a low trap density interface is formed with both surfaces of the active layer of metal oxide.

The desired objects of the instant invention are further achieved in accordance with a specific embodiment thereof wherein a metal oxide semiconductor device includes an active layer of metal oxide, a layer of gate dielectric, and a layer of low trap density material positioned between the active layer of metal oxide and the layer of gate dielectric. The layer of low trap density material has a first major surface parallel and in contact with the active layer of metal oxide to form a low trap density interface with the active layer of metal oxide. The layer of low trap density material has a second major surface parallel and in contact with the major surface of the layer of gate dielectric to form an interface with the layer of gate dielectric. The layer of low trap density material has a bandgap close to the bandgap of the active layer of metal oxide, and a low mobility compared to the active layer of metal oxide. The active layer of metal oxide, the layer of gate dielectric, and the layer of low trap density material are all generally included in one of a top gate, bottom source/drain type of device, a top gate, top source/drain type of device, a bottom gate, bottom source/drain type of device, a bottom gate, top source/drain type of device, or other thin film device.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Throughout this discussion it should be understood that thin film transistors (generally TFTs) are used as an example but that other thin film devices may be included in the definition of TFTs. The figure of merit in TFTs is defined by $\mu V/L^2$ where $\mu$ is the mobility, V is the voltage and L is the gate length. A major problem is partially remedied by the recent advance in metal oxide semiconductor materials in which mobility as high as 80 cm$^2$/V-sec has been demonstrated. One of the unique features of metal oxide semiconductors is that carrier mobility is less dependent on grain size of films, that is, high mobility amorphous metal oxide is possible.

Because of the materials used and the size of the devices (e.g. thickness of layers, length of gate, etc.) interfacial interactions of the metal oxide with the underlying and overlaying material are no longer negligible. As explained in detail in United States patent entitled "Metal Oxide TFT with Improved Carrier Mobility", issued on 12 Oct. 2010 bearing U.S. Pat. No. 7,812,346 and incorporated herein by reference, the control of interfacial interactions can be implemented in either or both of two ways: (1) interaction with the underlying structure; and (2) interaction with the overlying structure. In general, the interactions are designed to react with the oxygen in the metal oxide to beneficially alter the oxygen content and, thus, the carrier density.

In general, the type of material selected for forming the various upper and lower interfaces or providing the control of interfacial interactions with the metal oxide active layer is one way to determine the characteristics of the final device. Examples of metal oxides that can be used include $In_2O_3$ (Eg(indirect)=2.9 eV; Eg(direct)=3.7 eV), ZnO (Eg=3.3 eV), SnO (Eg=3.4 eV), CuO (Eg=2.2 eV), CdO (Eg=2.3 eV) InZnO, InSiO, InTiO, InTaO, InAlO, ZnAlO, ZnSiO, ZnTiO, ZnTaO, InGaZnO, InAlZnO, InSiZnO, InTiZnO, InTaZnO, and mixture oxides comprising the material or the metal-oxygen bond above. Examples of gate dielectric materials are $Al_2O_3$, $SiO_2$, SiN, and similar materials or combinations thereof.

At least two characteristics of TFTs that are important to the operation include gate leakage current and turn-on or threshold voltage. Gate leakage current can be reduced by increasing the thickness of the gate dielectric. However, increasing the thickness of the gate dielectric increases the gate voltage, which is undesirable. Thus, the preferred way to reduce gate leakage current without increasing turn-on voltage is to provide a large difference in bandgap, designated 'd' in FIG. 6, between the metal oxide semiconductor or active layer and the gate dielectric. It is also desirable that the threshold voltage of the TFT remains constant, i.e. threshold voltage should not change over time and/or multiple operations.

Figure 1:
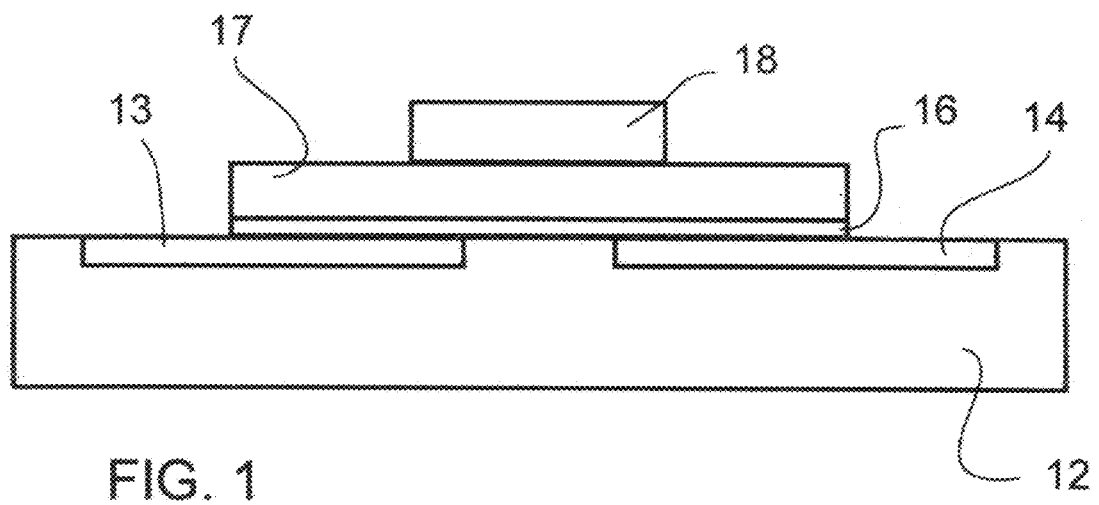
FIG. 1 is a simplified layer diagram of a TFT with overlying gate and underlying source/drain.

Turning now to FIG. 1, a simplified layer diagram of one embodiment of a TFT 10 is illustrated. TFT 10 includes a substrate or passivation layer 12, which may be a flexible material, such as plastic, or any other convenient material. Substrate or passivation layer 12 may optionally include a buffer (considered a part of substrate 22 if present) if desired. A source 13 and a drain 14 are formed in or on (hereinafter generically referred to as "on") the upper surface of substrate or passivation layer 12 in a spaced apart orientation using any well known method. A metal oxide film 16 is formed in partial overlying relationship to both source 13 and drain 14 and the space therebetween. It will be understood that metal oxide film 16 is the active layer that conducts carriers between the source/drain components. Generally, metal oxide layer 16 is less than 100 nm thick and preferably less than 50 nm. A thin gate dielectric layer 17 is formed in overlying relationship to metal oxide film 16 and a gate stack 18 is positioned on gate dielectric layer 17 in overlying relationship to the space between source 13 and drain 14. Thus, TFT 10 is a top gate, bottom source/drain type of device.

Figure 2:
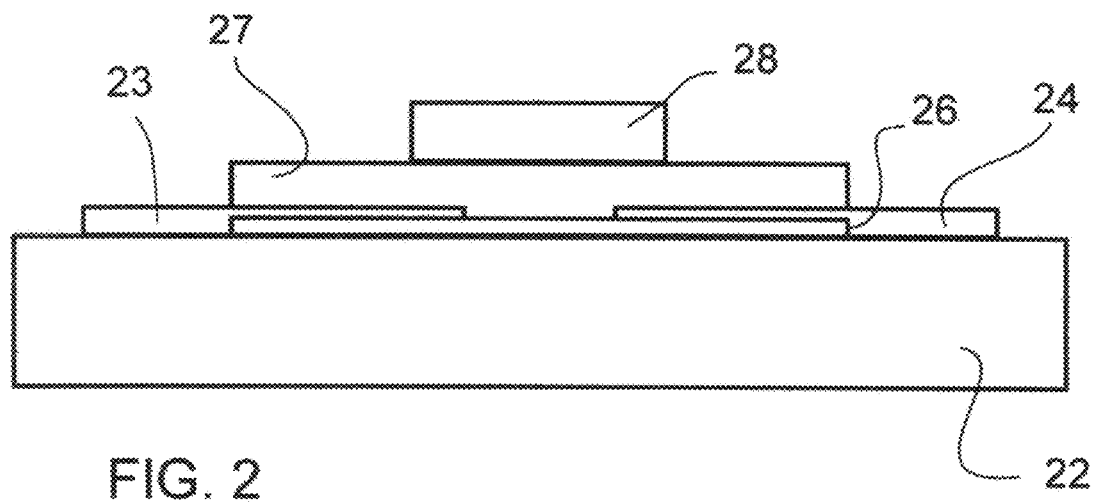
FIG. 2 is a simplified layer diagram of a TFT with overlying gate and overlying source/drain.

Turning now to FIG. 2, a simplified layer diagram of another embodiment of a TFT 20 is illustrated. TFT 20 includes a substrate or passivation layer 22, which may be a flexible material, such as plastic, or any other convenient material. Substrate or passivation layer 22 may optionally include a buffer (considered a part of substrate or passivation layer 22 if present) if desired. A metal oxide film 26 is deposited on substrate or passivation layer 22 and a source 23 and a drain 24 are formed partially in overlying relationship on the upper surface of metal oxide film 26 so as to form a spaced apart orientation on the upper surface. A thin gate dielectric layer 27 is formed in overlying relationship to metal oxide film 26 in the space between gate 23 and gate 24 and to portions of gate 23 and gate 24 adjacent to the space. A gate stack 28 is positioned on gate dielectric layer 27 in overlying relationship to the space between source 23 and drain 24. Thus, TFT 20 is a top gate, top source/drain type of device.

Figure 3:
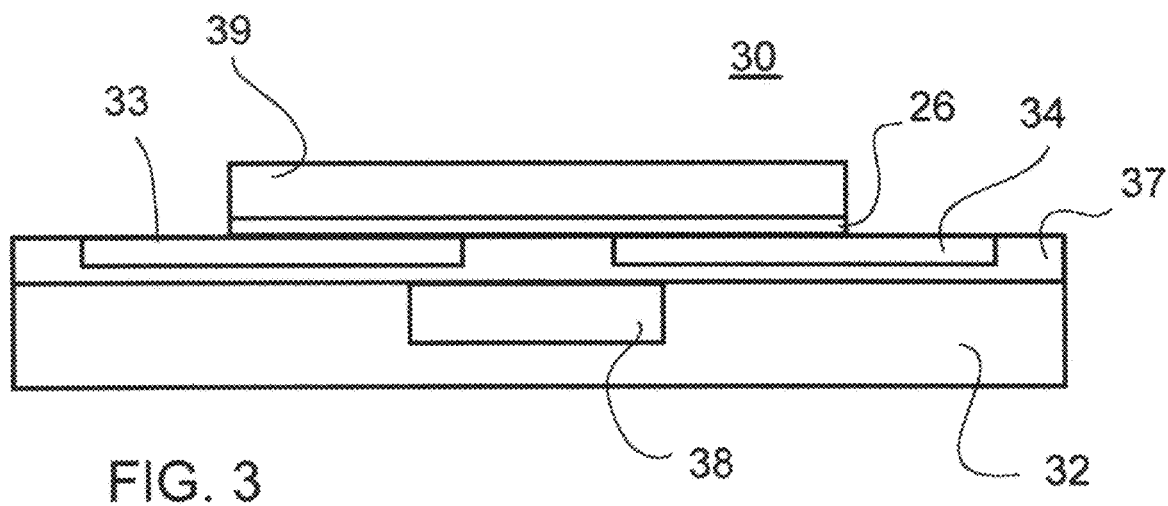
FIG. 3 is a simplified layer diagram of a TFT with underlying gate and underlying source/drain.

Turning now to FIG. 3, a simplified layer diagram of another embodiment of a TFT 30 is illustrated. TFT 30 includes a substrate or passivation layer 32, which may be a flexible material, such as plastic, or any other convenient material. A gate stack 38 is formed in substrate or passivation layer 32 by any convenient and established method. A thin gate dielectric layer 37 is formed in overlying relationship to gate stack 38 and the surrounding areas of substrate or passivation layer 32. A source 33 and a drain 34 are formed in or on (hereinafter generically referred to as "on") the upper surface of gate dielectric layer 37 in a spaced apart orientation using any well known method. A metal oxide film 36 is formed in partial overlying relationship to both source 33 and drain 34 and the space therebetween. An upper or second passivation layer 39 is formed over metal oxide film 36 in accordance with the present invention. Thus, TFT 30 is a bottom gate, bottom source/drain type of device.

Figure 4:
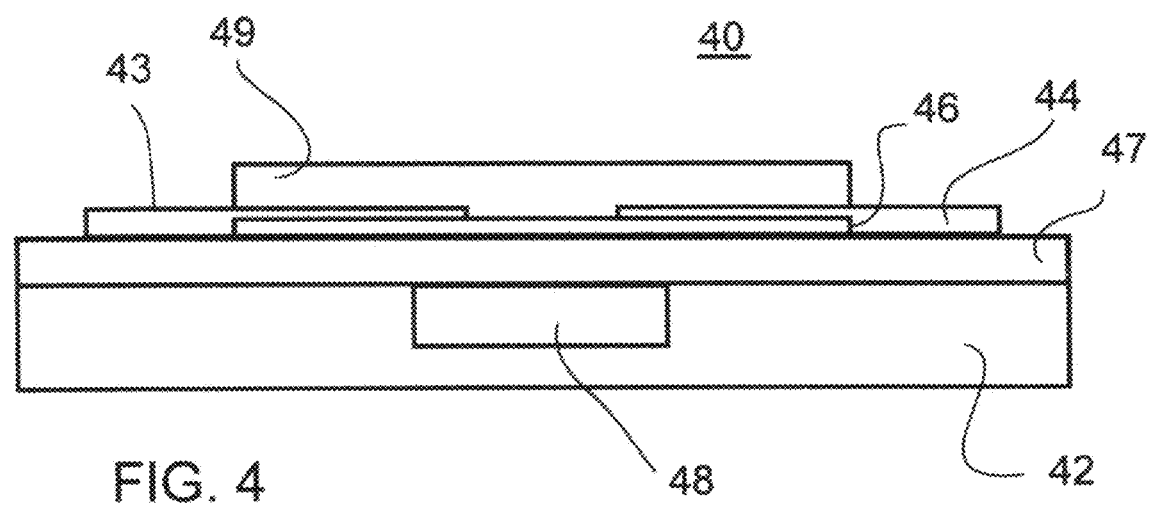
FIG. 4 is a simplified layer diagram of a TFT with underlying gate and overlying source/drain.

Turning now to FIG. 4, a simplified layer diagram of another embodiment of a TFT 40 is illustrated. TFT 40 includes a substrate or passivation layer 42, which may be a flexible material, such as plastic, or any other convenient material. A gate stack 48 is formed in substrate or passivation layer 42 by any convenient and established method. A thin gate dielectric layer 47 is formed in overlying relationship to gate stack 48 and the surrounding areas of substrate or passivation layer 42. A metal oxide film 46 is formed on gate dielectric layer 47 in overlying relationship to gate stack 48 and the surrounding area. A source 43 and a drain 44 are formed partially in overlying relationship on the upper surface of metal oxide film 46 so as to define a space therebetween on the upper surface overlying gate stack 48. An upper or second passivation layer 49 is formed over the exposed portion of metal oxide film 46 and the surrounding portions of source 43 and drain 44, in accordance with the present invention. Thus, TFT 40 is a bottom gate, top source/drain type of device.

The four embodiments of TFTs illustrated in FIGS. 1-4 are examples of different configurations that can be chosen. In each embodiment the semiconductor device has a metal oxide active layer generally less than 100 nm thick with an upper major surface and a lower major surface and the upper major surface and the lower major surface have material in abutting engagement to form underlying interfaces and overlying interfaces. In the preferred embodiment of any TFT the metal oxide active layer is amorphous material and remains amorphous throughout processing. In each embodiment or configuration a variety of choices and procedures during fabrication can be used to control interfacial interactions in the metal oxide active layer. Generally, the method of fabrication includes controlling characteristics and interfacial interactions by selecting a metal oxide for the metal oxide active layer and by selecting a specific dielectric for the gate dielectric material.

Figure 5:
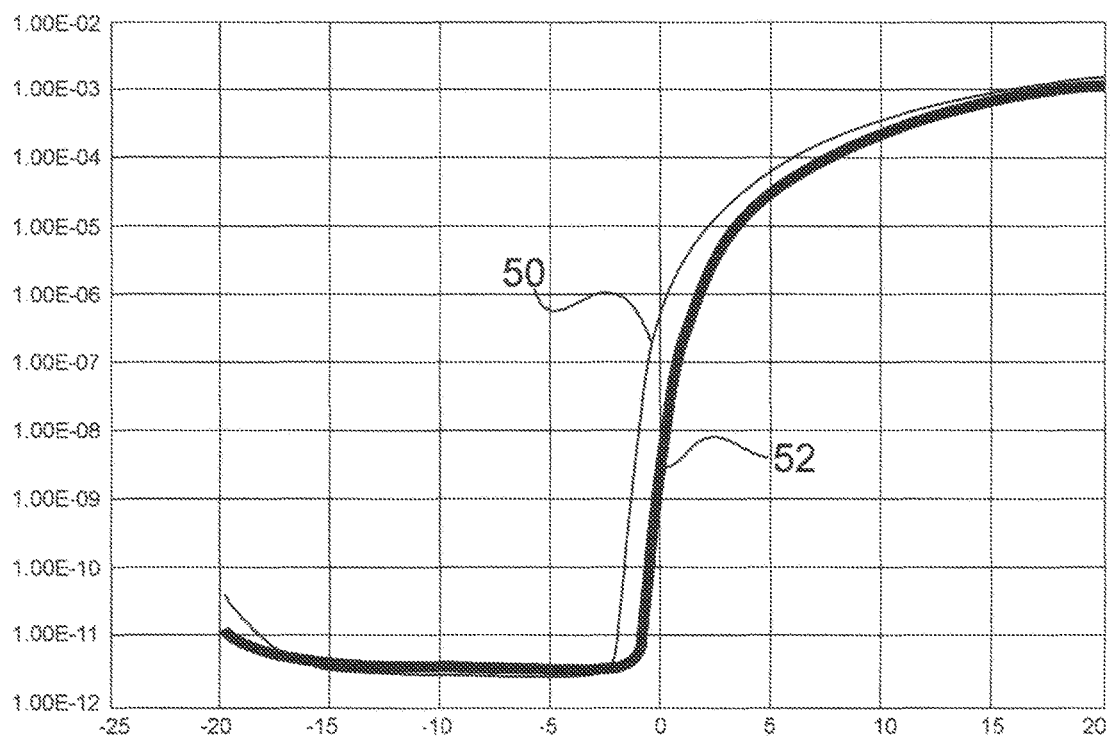
FIG. 5 is a graphic representation of typical positive threshold voltage shift in a TFT.

Referring specifically to FIG. 5, a graphic representation of typical positive threshold voltage shift in a TFT is illustrated. The threshold voltage for a first or initial turn-on or operation of the TFT is represented by a single line, designated 50. In subsequent operations, after operating under positive bias for a relatively long period of time, the threshold voltage shifts to the right (positive bias shift) as indicated by a series of lines, generally designated 52. As can be seen, an initial shift is relatively large and subsequent shifts tend to become relatively small but may still occur for a number of operations. This shifting or changing of the threshold voltage is referred to generally as instability of the TFT and is highly undesirable.

Figure 6:
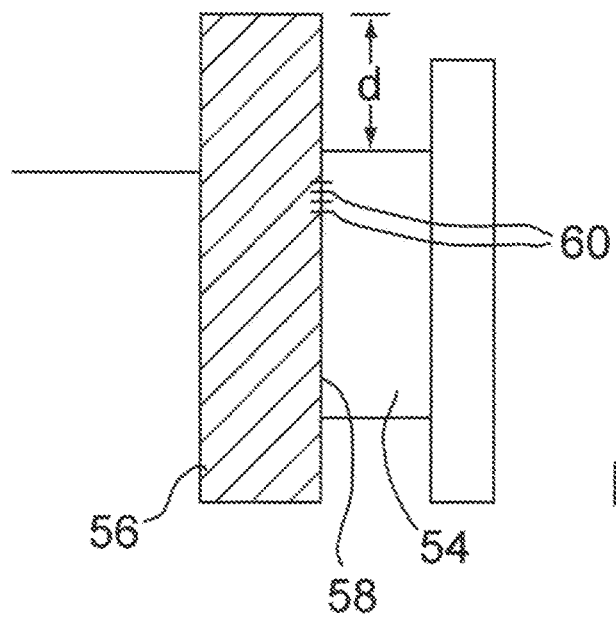
FIG. 6 is a bandgap representation of a metal oxide semiconductor with overlying or adjacent gate dielectric, illustrating typical deep bandgap traps formed at the interface.

Referring additionally to FIG. 6, a bandgap diagram representation of a metal oxide semiconductor 54 with overlying or abutting gate dielectric 56 is illustrated. The line 58 represents the interface between metal oxide semiconductor 54 and gate dielectric 56. Small lines or irregularities, designated 60, are included to represent traps formed at interface 58 because of irregularities in the materials. Generally, deep bandgap traps formed at the interface are the most troublesome and the most likely to manifest as a stability problem. Generally speaking, as the TFT is actuated (turned on) carriers have a tendency to initially accumulate in the traps and to remain "trapped" throughout operation of the TFT and even to remain in the trap after the TFT is turned off. This "trapping" of carriers causes the threshold voltage to gradually shift (after an initial relatively large step), as shown in the graph of FIG. 5. As also indicated by the graph, the traps eventually are filled with carriers and only very small movement, if any, occurs. The amount of shift is closely related to the deep trap density. In most instances, once carriers are trapped they remain trapped throughout operations (including off times) possibly for the entire life of the TFT.

Figure 7:
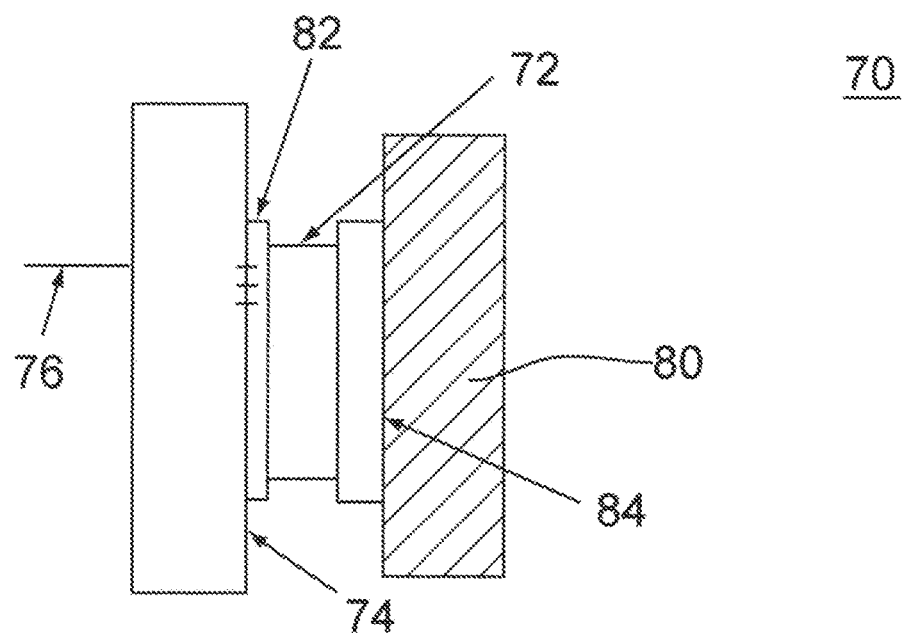
FIG. 7 is a bandgap diagram of a portion of a TFT in accordance with the present invention.

Referring to FIG. 7, a bandgap diagram is illustrated of a portion of a TFT 70 in accordance with the present invention. It should be understood that TFT 70 could represent any one of the embodiments illustrated in FIGS. 1-4 or any other TFT embodiment or device. TFT 70 includes an active layer of semiconductor amorphous metal oxide 72 such as zinc oxide (ZnO), indium zinc oxide (InZnO), indium zinc gallium oxide (InZnGaO), and any metal oxides from the above list. TFT 70 also includes a thin layer of gate dielectric material 74, such as $Al_2O_3$, $SiO_2$, SiN, and organic materials comprised with carbon-carbon bond in sp3 configuration. It will be noted that in accordance with good TFT fabrication techniques the bandgap of gate dielectric material 74 is much greater than the bandgap of semiconductor metal oxide 72 to reduce gate leakage current to a minimum. A gate metal/gate stack 76 is positioned on gate dielectric material 74 to form a gate contact in a well known fashion. Similarly, a passivation layer 80 is provided and may act as a base for support of the entire structure.

Traditionally, there are two interfaces of the semi-conducting metal oxide channel or active layer, one with the gate dielectric and one with the passivation layer. The stability under positive bias is the most related to the interface between the semi-conducting metal oxide and the gate dielectric, although the interface between the gate dielectric and the passivation layer may have some small effect. It is much more difficult to create low trap density at the interface between the semi-conducting metal oxide and the gate dielectric.

In accordance with the present invention, a very thin layer of low trap density or low defect insulator material 82 is placed between semi-conducting metal oxide 72 and gate dielectric 74. Optionally, a second low trap density or low defect insulator material 84 can be placed between semi-conducting metal oxide 72 and passivation layer 80. It has been found that there is a group of metal oxides in which defects do not generate trap states deep inside the bandgap. A preferred metal oxide of this type is titanium oxide ($TiO_2$), which has a bandgap similar but slightly larger than semi-conducting metal oxide 72 (as illustrated in FIG. 7). Some additional examples of low trap density insulators are $TiO_2$ (3.1 eV), $Ta_2O_5$ (3.4 eV), NbO (Eg=3.7 eV), $V_2O_5$ (Eg=3.87 eV), $ScO_2$ (Eg=4.0 eV), $Y_2O_3$ (5.5 eV), $ZrO_2$ (Eg=4.7 eV), $HfO_2$ (Eg=5.8 eV), $La_2O_5$ (5.5 eV), MoO, CrO, $SrTiO_3$, $SrNbO_3$, $CsTiO_3$, lead zirconate titanate (PZT), barium strontium titanate (BST), and the mixture oxide comprising the materials or the metal-oxygen bonds above. There are also a group of organic/organic-metallic materials that have a bandgap close to semi-conducting metal oxide 72 but have low trap density and low mobility. Some examples of this group of organic materials are Alq3: tris(8-hydroxyquinolinato) aluminum (III), BAlq3: Bis(2-methyl-8-quinolineolate)-4-(phenylphenolato) aluminium, Bepq2: Bis(10-hydroxybenzo[h]quinolinato) Beryllium, PBD: 2-(4-Biphenyl)-5-(4-tert-butylphenyl)-1,3,4-oxadiazole, TAZ: 3-(4-Biphenyl)-4-phenyl-5-tert-butylphenyl-1,2,4-triazole, Bphen: 4,7-Diphenyl-1,10-phenyanthroline, and other electron transport or hole-blocking materials known to the experts in the field of organic light emitting or photovoltaic devices. C60, C70, nanotube, and other fullerene molecules, Graphene molecules, PMGI (polymethylglutarimide), BCB (bis-benzocyclobutene), SU-8 (a commonly used epoxy-based negative photoresist, and PMMA (Poly(methyl methacrylate).

All of the low trap density materials (i.e. metal oxides and organic materials) have a low mobility and cannot be used as the semi-conducting channel material. Also, all of the low trap density materials (i.e. metal oxides and organic materials) have a bandgap close to semi-conducting metal oxide 72 and, thus, cannot be used as the gate dielectric.

Preferably, the metal-oxide used for the low-defect layer can be processed by one of the following methods or their combinations: PVD (physical vapor deposition such as thermal, e-Beam, or sputter), CVD (chemical vapor deposition), ALD (atomic layer deposition), the film can be formed by condensation on to the gate insulator surface from a saturated solution, the film can be formed by a Sol-gel solution processed by casting, spin-coating, slot-coating, screen printing, transfer printing, inkjet printing, stamping and other type process methods known to the experts in the arts. The thin low trap metal-oxide film can also be formed from a corresponding organo-metallic precursor solution by means of "hydrolysis". The precursor steps include preparing corresponding organo-metallic compound precursor solution, film forming by casting or printing the precursor solution onto the target area on the substrate, and then a conversion process by hydrolysis and post baking. An example of forming a $TiO_x$ film between the active layer and the cathode in a photovoltaic cell has been described in *Advanced Material*, Vo. 18, pp 572-576, (2006).

The following are examples of preparing $TiO_2$ and $CsTiO_3$ films: $TiO_2$ film was spin-casted from 0.25 wt % of $TiO_2$ solution in a 1:1 volume ratio of 2-ethoxyethanol and ethanol at 1000 rpm, followed by thermal annealing at temperature of 100-200 C for 5-30 minutes. $CsTiO_3$ film was spin-coated from a solution prepared by blending 0.5 and 0.2 wt % solutions of $TiO_2$ and $Cs_2CO_3$ in a proper volume, followed by thermal annealing elevated temperature in 100-200 C range for 5-50 minutes. Dense amorphous metal-oxide film can also be formed by corresponding organo-metallic compound precursor solution by casting or printing following a conversion process by hydrolysis and post baking. An example of forming $TiO_x$ film with such process has been described in Advanced Material, Vol 18, pp 572-576 (2006).

The low-defect layer can be processed by means of PMOD: photochemical metal organic deposition of thin amorphous metal oxide films, such processes allow patterned film to be made without additional photoresist and corresponding etching process. Examples of processing metal-oxide and metal films by PMOD can be found from the following references:

1. "Solid State PhotoChemistry of Cu2(OH2)2(O2C (CH2)4CH3)4 in Thin Films: The Photochemical Formation of High Quality Films of Copper and Copper(I) Oxide. Demonstration of a Novel Lithographic Technique for the Patterning of Copper" A. A. Avey and R. H. Hill J. Am. Chem. Soc. 118 1996 237.
2. "An Inorganic Approach to Photolithography: The photolithographic Deposition of Dielectric Metal Oxide Films" R. H. Hill and S. L. Blair ACS Symposium Series 706.

The carbon based fullerene, nanotube, and graphene films, the organometallic compound based films, and the organic molecule based films can be formed by PVD, or by one of solution processes known to the experts in the arts including (but not limited by) casting, spin-coating, slot-coating, screen printing, transfer printing, inkjet printing, stamping.

It should be understood that by sandwiching low trap density insulator material 82 between semi-conducting metal oxide 72 and gate dielectric 74 conduction carriers in device 70 are confined to semi-conducting metal oxide 72. There is little trap density at the interface between semi-conducting metal oxide 72 and low trap density insulator material 82. Even though there may be deep traps at the interface between gate dielectric 74 and low trap density insulator material 82 the conduction carriers cannot reach that interface to induce instability.

The very thin layer of low trap density or low defect insulator material 82 placed between semi-conducting metal oxide 72 and gate dielectric 74 can be as thin as a few nanometers (e.g. 5 nm to 50 nm). Similarly, optional second low trap density or low defect insulator material 84 can be the same material as material 82 or any other of the above mentioned examples and can have a similar or different thickness, depending on the fabrication methods utilized. Also, the various materials of TFT 70 can be deposited in any well known manner related to the material being deposited. Some examples of deposition techniques are provided in the above described patent application.

Further, the final device constructed in accordance with the present invention is novel because the fabricated structure controls trap density in the interfaces of the semi-conducting metal oxide active layer and, therefore, the characteristics and stability of the final device. Thus, a new and improved metal oxide semiconductor device is disclosed in which trap density in the interfaces of the metal oxide channel is very low and therefore the stability of the TFT device is improved. Also, a new and improved method of fabricating a metal oxide semiconductor device with reduced trap density is disclosed.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

Having fully described the invention in such clear and concise terms as to enable those skilled in the art to understand and practice the same, the invention claimed is:

1. A metal oxide semiconductor device comprising:
   an active layer of metal oxide with a major surface, the active layer of metal oxide having a bandgap;
   a layer of gate dielectric overlying and in parallel abutting engagement with a metal gate contact, the layer of gate dielectric having a first major surface parallel and in contact with the metal gate contact and a second major surface parallel with and opposed to the first major surface, and the layer of gate dielectric comprising oxygen in the bulk and/or at the first major surface, the layer of gate dielectric having a bandgap much larger than the bandgap of the active layer of metal oxide;
   a layer of low trap density material positioned between the active layer of metal oxide and the layer of gate dielectric, the layer of low trap density material being thinner than the layer of gate dielectric, the layer of low trap density material having a first major surface parallel and in contact with the active layer of metal oxide to form a low trap density interface with the active layer of metal oxide, the layer of low trap density material having a second major surface parallel and in contact with the second major surface of the layer of gate dielectric to form an interface with the layer of gate dielectric, the layer of low trap density material having a bandgap close to the bandgap of the active layer of metal oxide, and the layer of low trap density material having a low mobility compared to the active layer of metal oxide, and the low trap density material being either amorphous or with grain size 50 nm or less; and
   the active layer of metal oxide, the layer of gate dielectric, and the layer of low trap density material are all included in one of a top gate, bottom source/drain type of device, a top gate, top source/drain type of device, a bottom gate, bottom source/drain type of device, and a bottom gate, top source/drain type of device.

2. A metal oxide semiconductor device as claimed in claim 1 wherein the layer of low trap density material includes one of TiO, $Ta_2O_5$, NbO, $V_2O_5$, $ScO_2$, $Y_2O_3$, $ZrO_2$, $HfO_2$, $La_2O_5$, MoO, CrO $SrTiO_3$, $SrNbO_3$, lead zirconate titanate (PZT), barium strontium titanate (BST), and a mixture oxide comprising more than one of the materials or the metal-oxygen bonds above.

3. A metal oxide semiconductor device as claimed in claim 1 wherein the layer of low trap density material includes one of a group of organic materials including Alq3: tris (8-hydroxyquinolinolato) aluminum (III) Balq3: Bis(2-methyl-8-quinolineolate)-4-(phenylphenolato) aluminium, Bepq2: Bis(10-hydroxybenzo[h]quinolinato) Beryllium, PBD: 2-(4-Biphenyl)-5-(4-tert-butylphenyl)-1,3,4-oxadiazole, TAZ: 3-(4-Biphenyl)-4-phenyl-5-tert-butylphenyl-1,2, 4-triazole, Bphen: 4,7-Diphenyl-1,10-phenanthroline, C60, C70, nanotube, and other fullerene molecules, Graphene molecules, PMGI (polymethylglutarimide), BCB (bis-benzocyclobutene), SU-8, and PMMA (Poly(methyl methacrylate).

4. A metal oxide semiconductor device comprising:
an active layer of metal oxide with a major surface, the active layer of metal oxide having a bandgap;
a layer of gate dielectric overlying and in parallel abutting engagement with a metal gate contact, the layer of gate dielectric having a first major surface parallel and in contact with the metal gate contact and a second major surface parallel with and opposed to the first major surface, and the layer of gate dielectric comprising oxygen in the bulk and/or at the first major surface, the layer of gate dielectric having a bandgap much larger than the bandgap of the active layer of metal oxide;
a layer of low trap density material positioned between the active layer of metal oxide and the layer of gate dielectric, the layer of low trap density material being thinner than the layer of gate dielectric, the layer of low trap density material having a first major surface parallel and in contact with the active layer of metal oxide to form a low trap density interface with the active layer of metal oxide, the layer of low trap density material having a second major surface parallel and in contact with the second major surface of the layer of gate dielectric to form an interface with the layer of gate dielectric, and the layer of low trap density material having a bandgap close to the bandgap of the active layer of metal oxide.

5. A metal oxide semiconductor device as claimed in claim 4 wherein the layer of low trap density material has a low mobility compared with the active layer of metal oxide, and the low trap density material is either amorphous or with grain size 50 nm or less.

6. A metal oxide semiconductor device as claimed in claim 4 wherein the layer of low trap density material includes one of TiO, $Ta_2O_5$, NbO, $V_2O_5$, $ScO_2$, $Y_2O_3$, $ZrO_2$, $HfO_2$, $La_2O_5$, MoO, CrO $SrTiO_3$, $SrNbO_3$, lead zirconate titanate (PZT), barium strontium titanate (BST), and a mixture oxide comprising more than one of the materials or the metal-oxygen bonds above.

7. A metal oxide semiconductor device as claimed in claim 4 wherein the layer of low trap density material includes one of a group of organic materials including Alq3: tris (8-hydroxyquinolinolato) aluminum (III) Balq3: Bis(2-methyl-8-quinolineolate)-4-(phenylphenolato) aluminium, Bepq2: Bis(10-hydroxybenzo[h]quinolinato) Beryllium, PBD: 2-(4-Biphenyl)-5-(4-tert-butylphenyl)-1,3,4-oxadiazole, TAZ: 3-(4-Biphenyl)-4-phenyl-5-tert-butylphenyl-1,2,4-triazole, Bphen: 4,7-Diphenyl-1,10-phenyanthroline, C60, C70, nanotube, and other fullerene molecules, Graphene molecules, PMGI (polymethylglutarimide), BCB (bis-benzocyclobutene), SU-8, and PMMA (Poly(methyl methacrylate).

8. A metal oxide semiconductor device as claimed in claim 4 wherein the layer of low trap density material has a thickness in a range of 5 nm to 50 nm.

9. A metal oxide semiconductor device as claimed in claim 4 wherein the active layer of metal oxide has an opposed major surface, and the device further includes a second layer of low trap density material having a major surface parallel and in contact with the opposed major surface of the active layer of metal oxide to form a low trap density interface with the opposed major surface of the active layer of metal oxide.

10. A metal oxide semiconductor device as claimed in claim 4 wherein the active layer of metal oxide, the layer of gate dielectric, and the layer of low trap density material are all included in one of a top gate, bottom source/drain type of device, a top gate, top source/drain type of device, a bottom gate, bottom source/drain type of device, and a bottom gate, top source/drain type of device.

11. A metal oxide semiconductor device comprising:
an active layer of metal oxide with a major surface;
a layer of gate dielectric overlying and in parallel abutting engagement with a metal gate contact, the layer of gate dielectric having a first major surface parallel and in contact with the metal gate contact and a second major surface parallel with and opposed to the first major surface, and the layer of gate dielectric comprising oxygen in the bulk and/or at the first major surface; and
a layer of low trap density material positioned between the active layer of metal oxide and the layer of gate dielectric, the layer of low trap density material being thinner than the layer of gate dielectric, the layer of low trap density material having a first major surface parallel and in contact with the active layer of metal oxide to form a low trap density interface with the active layer of metal oxide and a second major surface in parallel and in contact with the second major surface of the layer of gate dielectric.

12. A metal oxide semiconductor device as claimed in claim 11 wherein the active layer of metal oxide has a bandgap and the layer of gate dielectric has a bandgap much larger than the bandgap of the active layer of metal oxide, and the layer of low trap density material has a bandgap close to the bandgap of the active layer of metal oxide, and the low trap density material is either amorphous or with grain size 50 nm or less.

13. A metal oxide semiconductor device as claimed in claim 11 wherein the layer of low trap density material has a low mobility compared with the active layer of metal oxide.

14. A metal oxide semiconductor device as claimed in claim 11 wherein the layer of low trap density material includes one of TiO, $Ta_2O_5$, NbO, $V_2O_5$, $ScO_2$, $Y_2O_3$, $ZrO_2$, $HfO_2$, $La_2O_5$, MoO, CrO $SrTiO_3$, $SrNbO_3$, lead zirconate titanate (PZT), barium strontium titanate (BST), and a mixture oxide comprising more than one of the materials or the metal-oxygen bonds above.

15. A metal oxide semiconductor device as claimed in claim 11 wherein the layer of low trap density material includes one of a group of organic materials including Alq3: tris (8-hydroxyquinolinolato) aluminum (III), Balq3: Bis(2-methyl-8-quinolineolate)-4-(phenylphenolato) aluminium, Bepq2: Bis(10-hydroxybenzo[h]quinolinato) Beryllium, PBD: 2-(4-Biphenyl)-5-(4-tert-butylphenyl)-1,3,4-oxadiazole, TAZ: 3-(4-Biphenyl)-4-phenyl-5-tert-butylphenyl-1,2,4-triazole, Bphen: 4,7-Diphenyl-1,10-phenyanthroline, C60, C70, nanotube, and other fullerene molecules, Graphene molecules, PMGI (polymethylglutarimide), BCB (bis-benzocyclobutene), SU-8, and PMMA (Poly(methyl methacrylate).

16. A metal oxide semiconductor device as claimed in claim 11 wherein the active layer of metal oxide includes a layer of semiconductor amorphous metal oxide.

17. A metal oxide semiconductor device as claimed in claim 11 wherein the active layer of metal oxide has an opposed major surface, and the device further including a second layer of low trap density material having a major surface parallel and in contact with the opposed major surface of the active layer of metal oxide to form a low trap density interface with the opposed major surface of the active layer of metal oxide.

18. A metal oxide semiconductor device as claimed in claim 11 wherein the active layer of metal oxide, the layer of gate dielectric, and the layer of low trap density material are all included in one of a top gate, bottom source/drain type of device, a top gate, top source/drain type of device, a bottom gate, bottom source/drain type of device, and a bottom gate, top source/drain type of device.

19. A metal oxide semiconductor device as claimed in claim 11 wherein the layer of low trap density material has a thickness in a range of 5 nm to 50 nm.

* * * * *